(12) United States Patent
Parker et al.

(10) Patent No.: US 8,918,067 B2
(45) Date of Patent: Dec. 23, 2014

(54) SERVO LOOP FOR QUALITY-FACTOR COMPENSATION IN A CAPACITOR ARRAY

(75) Inventors: James F. Parker, Beaverton, OR (US); Jeffrey L. Sonntag, Portland, OR (US)

(73) Assignee: Silicon Laboratories Inc., Austin, TX (US)

( * ) Notice: Subject to any disclaimer, the term of this patent is extended or adjusted under 35 U.S.C. 154(b) by 913 days.

(21) Appl. No.: 12/774,459

(22) Filed: May 5, 2010

(65) Prior Publication Data

US 2011/0275334 A1 Nov. 10, 2011

(51) Int. Cl.
*H03C 1/52* (2006.01)
*H04B 1/04* (2006.01)
*H03H 11/30* (2006.01)

(52) U.S. Cl.
CPC .............. *H04B 1/0458* (2013.01); *H03H 11/30* (2013.01)
USPC ............. 455/107; 327/308; 327/512; 327/77; 327/108; 327/427; 327/536; 327/378; 326/30

(58) Field of Classification Search
USPC ........... 327/108, 208, 308, 512, 77, 427, 536, 327/378; 340/10.5; 455/107; 326/30
See application file for complete search history.

(56) References Cited

U.S. PATENT DOCUMENTS

| | | | |
|---|---|---|---|
| 4,093,874 A | 6/1978 | Pollitt | |
| 5,422,588 A | 6/1995 | Wynne | |
| 5,864,302 A * | 1/1999 | Kokubu et al. | 340/10.5 |
| 6,114,897 A | 9/2000 | Ham | |
| 6,154,085 A | 11/2000 | Ramakrishnan | |
| 6,437,610 B1 | 8/2002 | Schrödinger | |
| 7,199,641 B2 | 4/2007 | Wei | |
| 7,595,683 B1 | 9/2009 | Floyd | |
| 7,671,661 B2 * | 3/2010 | Jung et al. | 327/512 |
| 7,683,699 B2 | 3/2010 | Fort et al. | |
| 2006/0181340 A1 * | 8/2006 | Dhuyvetter | 330/6 |
| 2007/0159228 A1 * | 7/2007 | Nguyen | 327/308 |
| 2008/0211548 A1 * | 9/2008 | Hayashi et al. | 327/108 |

OTHER PUBLICATIONS

Brooks, T. L et al., "A Cascaded Sigma-Delta Pipeline A/D Converter with 1.25 MHz Signal Bandwidth and 89 dB SNR," IEEE Journal of Solid-State Circuits, vol. 32; Issue 12, Dec. 1997, pp. 1896-1906.

\* cited by examiner

*Primary Examiner* — Junpeng Chen
(74) *Attorney, Agent, or Firm* — Abel Law Group, LLP

(57) ABSTRACT

The impedance of the elements of a capacitor array in the transmitter is kept substantially constant over changes in process, temperature, and supply voltage. The impedance is maintained substantially constant by compensating a gate voltage supplied to switches in each element of the capacitor array to adjust for changes in temperature and supply voltage to thereby maintain a substantially constant RC product for each unit element in the capacitor array and thereby improve the quality factor of the capacitor array.

14 Claims, 3 Drawing Sheets

SERVO LOOP FOR QUALITY-FACTOR COMPENSATION IN A CAPACITOR ARRAY

BACKGROUND

1. Field of the Invention

This invention relates to controlling variable resistance and more particularly to maintaining a constant impedance in variable capacitor arrays.

2. Description of the Related Art

In short-range wireless applications, the load of the transmitter is often high impedance as it consists only of the real portion of a high quality factor LC tank circuit. For these applications, a simple loop antenna on the PC board forms the inductor, L, and the transmitter usually incorporates at least a portion of the capacitive load, C. In order to tune out manufacturing variations in both L and C, it is desirable to make the transmitter capacitor variable so that the tank circuit can be tuned precisely to resonate at the desired operating frequency. That helps maximize the efficiency of the overall system by minimizing loss.

One way to produce a variable capacitance is to provide multiple capacitive elements, which can be selectively switched into the load under digital control. One problem with such an approach is that the switches have non-zero on resistance, and therefore cause a loss of power. Furthermore, the switch resistance, and therefore the amount of the power loss, depends on processing, temperature, and switching voltage. In many applications it is desirable for the transmitted power to be well controlled. Variation in switch resistance leading to variations in transmitted power can be somewhat alleviated by using large switch devices in the capacitor array. However, there are two main problems with that approach. One, the area of the capacitor array can become excessively large. Two, the parasitic capacitance associated with the switch causes the ratio of the "off" to "on" capacitance of the array to degrade. Ideally, the "off" capacitance would be zero; however, parasitic capacitance due to the capacitor itself and the switch cause the "off" capacitance to be larger than zero. A non-zero "off" capacitance reduces the tuning range of the variable capacitor because it reduces the difference between the capacitance of the array element when it is "on" versus when it is "off." Even if the switch resistance is reduced by increasing the size of switch, this does not address the non-zero temperature dependence of the transmitted power.

Accordingly, it would be desirable to provide constant switch resistance in the capacitor array to avoid variation in transmitted power and to allow for improved "off" to "on" capacitance ratios.

SUMMARY

Accordingly, in one embodiment, a method is provided that includes enabling a unit element of a variable capacitor array by supplying one or more transistors within the unit element a gate voltage that adjusts to compensate for variations in at least one of supply voltage and temperature, to maintain a substantially constant impedance of the unit element. The method compares a resistance of one or more replica devices corresponding to the one or more transistors within the unit element with a desired resistance value and adjusts the resistance of one or more replica devices to substantially maintain the desired resistance value by adjusting the gate voltage.

In an embodiment, comparing the resistance to a desired resistance value further comprises comparing a voltage across the one or more replica devices with a reference voltage. In another embodiment the method includes comparing a reference resistance to the resistance associated with one or more replica devices, the reference resistance corresponding to the desired resistance value, generating an indication of the comparison, and adjusting the gate voltage according to the comparison.

In another embodiment, an apparatus includes a capacitor array that includes a plurality of unit elements. Each unit element includes at least one capacitor and at least one transistor to enable charging of the at least one capacitor. A control voltage circuit supplies a gate voltage to the gate of the at least one transistor that varies according to changes in at least one of temperature and supply voltage, to thereby maintain a resistance-capacitance (RC) product of unit element substantially constant over changes in the temperature and the supply voltage, when the capacitance array unit element is enabled. The control voltage circuit comprises a compare circuit to compare resistance of one or more replica devices corresponding to the one or more transistors to a desired value. In an embodiment the compare circuit is coupled to compare a reference voltage corresponding to the desired value and a voltage across the one or more replica devices, which corresponds to the resistance of the one or more replica devices. In another embodiment a voltage across a reference resistance is compared to the voltage across the one or more replica devices.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
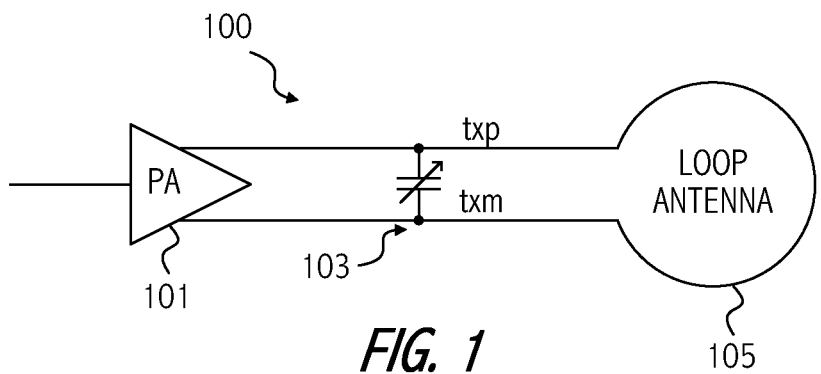
FIG. 1 illustrates a portion of a transmitter system suitable for incorporating an embodiment of the invention.
Figure 2A:
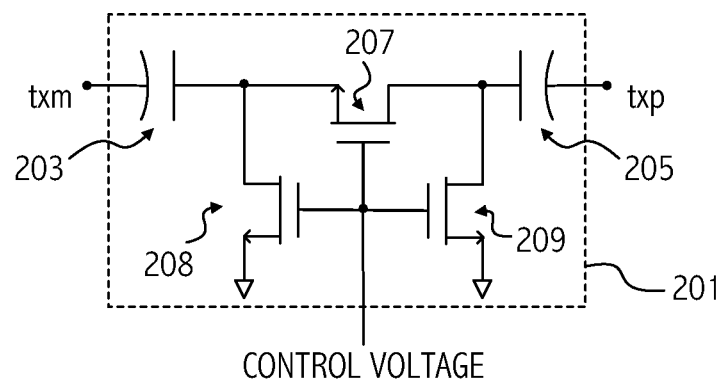
FIG. 2A illustrates a embodiment of a unit element of the capacitor array shown in FIG. 1.

FIG. 1 illustrates a portion of a transmitter system 100 that includes a power amplifier 101, a differential variable capacitor array 103 that is coupled to a loop antenna 105. FIG. 2A illustrates a differential embodiment of a capacitive element 201 of array 103 that includes two capacitors 203 and 205 on each of the differential transmit outputs txm and txp and a differential switch 207. Two additional switches 208 and 209 set the common-mode (CM) voltage on both sides of the differential switch at ground when the capacitor element is enabled. Tuning the capacitor array is accomplished by switching on and off the appropriate number of unit elements of the capacitor array 103 using the control voltage supplied to the switches 207, 208, and 209 in each of the unit elements.

Figure 2B:
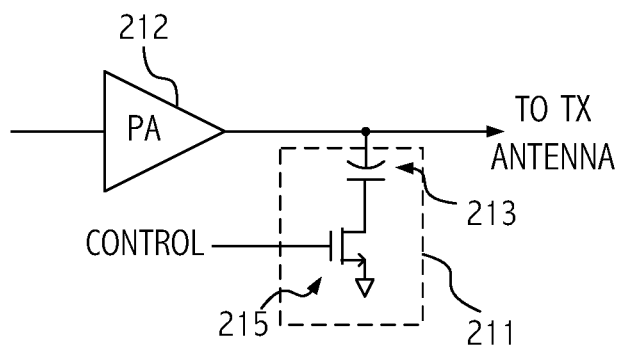
FIG. 2B illustrates a single-ended embodiment of a unit element of a capacitor array.

FIG. 2B illustrates an exemplary individual unit element 211 of a capacitor array in a single-ended embodiment. Power amplifier 212 drives the antenna (not shown in FIG. 2B). The exemplary unit element 211 of a capacitor array includes capacitor 213 and a switch 215. Tuning the capacitor array is accomplished by switching on and off the appropriate number of unit elements of the capacitor array using the control voltage supplied to the switch 215 in each of the unit elements.

If the gate of a switch is tied to the power supply, variation in the power supply modulates the switch resistance in the capacitor array. In turn, that gives rise to a variation in transmitted power, which is usually undesirable. That problem can particularly noticeable in battery-operated systems, as the supply voltage can vary over a 2:1 range during the lifetime of the battery.

To overcome that problem, embodiments of the present invention create a control voltage for the switches in the capacitor array elements that is independent of variations in the battery voltage and manufacturing and that tracks out the temperature-dependence of the switch, to create a substantially constant switch resistance over variations in temperature, process, and supply voltage. That leads to a more constant transmitted power. Further, by carefully increasing the range of this control voltage, the switch size can be reduced, which reduces its parasitic capacitance, reducing the "off" capacitance of the array and increasing the overall tuning range that is possible with the capacitor array. The control voltage range may be increased by looking at the worst-case process corner and temperature and designing the switch size to yield a gate voltage Vmax at that worst-case corner.

Figure 3:
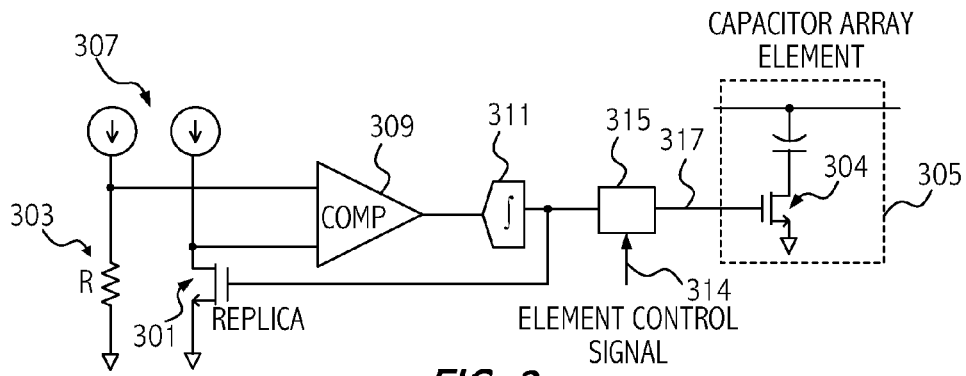
FIG. 3 illustrates a high level diagram of an embodiment of the invention.

Referring to FIG. 3, a simplified high level diagram of an embodiment of a servo-loop is illustrated that maintains a substantially constant impedance in the unit elements of the capacitor array. The embodiment in FIG. 3 compares the resistance across a replica transistor 301 to a reference resistance 303. The replica transistor 301 is a replica of the switch 304 in capacitor array element 305. In an embodiment, current sources 307 provide identical current to reference resistance 303 and replica transistor 301. The resistances are compared by comparing the voltage across replica switch 301 to the voltage across the reference resistance 303 in comparator 309. The difference in the two voltages, which corresponds to the difference in the two resistances (the drain to source resistance of transistor 301 and reference resistance 303), is integrated in integrator 311. The integrated value provides the voltage used as the gate voltage for switch 304. A capacitor array control block (not shown) provides a digital control signal 314 to selectively enable a capacitive array element to achieve the desired capacitance. That digital control signal is converted in block 315, to a gate voltage 317 having a value determined by integrator 311, and is supplied as a gate signal for switch 304.

Note that evaluating the resistances can be accomplished in various ways. In other embodiments, a voltage across the two resistances is used to generate currents that are then compared to determine an appropriate gate voltage to maintain substantially constant switch resistance. In still other embodiments, the reference resistance may be put in series with the replica device (or devices) and the expected voltage between them can be compared to a reference voltage. The goal is to maintain the drain to source resistance of the replica transistor and thus the switch transistor constant by adjusting the gate voltage.

Figure 4:
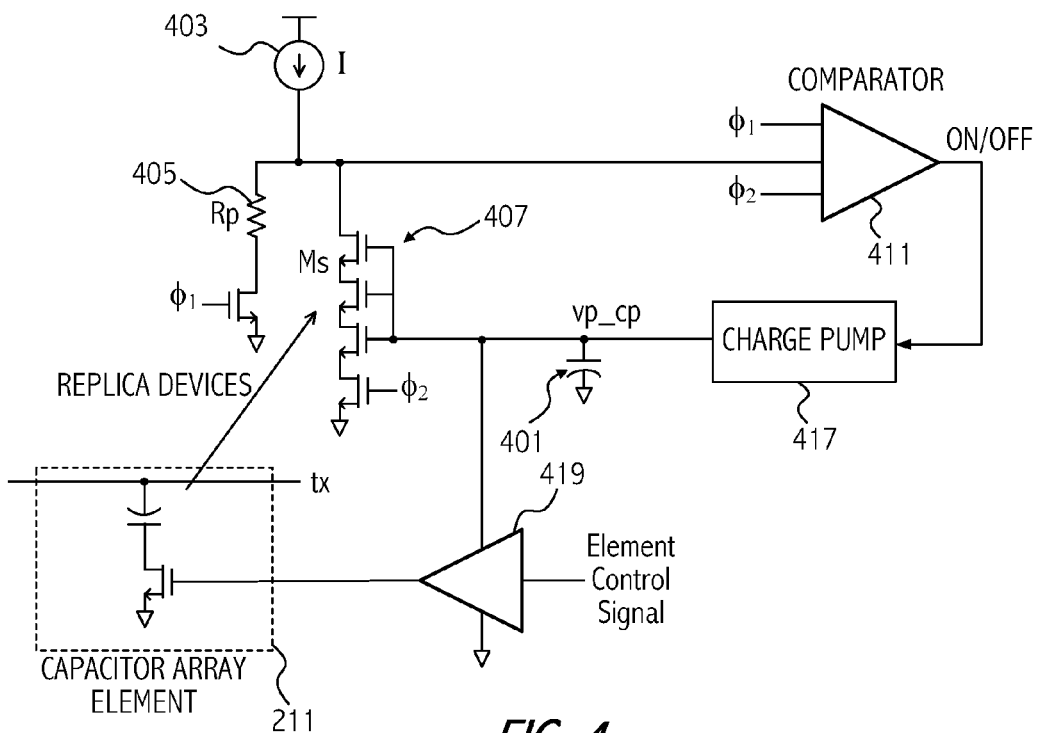
FIG. 4 illustrates a high level diagram of another embodiment of the invention using a servo-loop to charge a capacitor to supply a gate voltage.

Referring to FIG. 4, an exemplary high level diagram of another embodiment of a servo-loop is illustrated to provide a control mechanism to maintain a substantially constant impedance in the unit elements of the capacitor array. The servo loop creates a variable supply voltage (vp_cp) across capacitor 401 that varies to keep the RC product of the capacitor array element constant over process, temperature, and variations in the battery (or other supply) voltage. The servo loop includes a single current source (I) 403 that is switched between a low temperature coefficient polysilicon resistor (Rp) 405 and an array of series MOS switches (Ms) 407 that replicate the switch device(s) in the capacitor array. In an embodiment, the voltage and temperature coefficients of the polysilicon resistor 405 are very low, keeping the resistor substantially constant in value over the voltage and temperature ranges of an exemplary embodiment. In addition, in one particular embodiment, the resistor variation over process for the polysilicon resistor is less than 5%. That level of resistor variation is sufficiently low in some embodiments to make it unnecessary to trim the resistor value to improve the accuracy of the servo-loop. However, in other embodiments, where more accuracy is desired, or the process variation for the resistor 405 is unacceptably high, the resistor may be trimmed during production test to adjust its resistance to take out process variations.

In operation, the servo-loop compares the IR drop across the polysilicon resistor 405 and the series NMOS devices 407. In the illustrated embodiment, the IR drops are alternately coupled to the current source 403 using non-overlapping clocks $\phi_1$ and $\phi_2$. In an embodiment, the voltages are supplied to a switched capacitor comparator 411 that samples one voltage during $\phi_1$ and another voltage during $\phi_2$ and provides the comparison result as an ON/OFF signal to charge pump 417.

When the servo-loop circuit first starts up, the voltage vp_cp across the capacitor 401 is low relative to its final value. Note that the voltage vp_cp is supplied to the gates of the replica devices. With the voltage at the gates of the replica devices 407 relatively low, the resistance of the series NMOS devices is relatively high compared to the resistance of Rp, causing the IR drop across Rp to be much less than the IR drop across the replica devices. That causes the output of the comparator 415 to be high, which enables the charge pump 417. That allows a voltage to be integrated on the charge pump capacitor 401 until the charge pump voltage (vp_cp) driven to the gate of the replica devices 407 forces the IR drop across these devices to be less than the IR drop of the polysilicon resistor 405. At that point, the comparator 415 drives an output signal low and the charge pump is disabled. The charge pump remains disabled until leakage causes vp_cp to drop, thereby decreasing the gate voltage to the replica devices and resulting in the IR drop of the replica devices 407 again to exceed that of the polysilicon resistor 405. At that point, the comparator output is driven high and the charge pump is re-enabled.

The voltage vp_cp functions as the power supply for logic gate 419 that drives the gates of the switches in the capacitor array. In FIG. 4, the logic gate is powered from vp_cp and takes a control signal for enabling/disabling a particular capacitor array element and translates it to the vp_cp supply domain. Thus, logic gate 419 supplies vp_cp as the gate voltage to the capacitor element switch when the capacitor array element is enabled. Thus, when implemented as an inverter a logical one (assumed in this example to be active low) is converted to the vp_cp domain and a logical zero is coupled to ground to shut off the switch devices. Because the voltage vp_cp varies as needed to maintain the resistance of the replica devices to be substantially the same as the resistance of the resistor Rp 305, the RC product of each element of the capacitor array is maintained substantially the same over variations in process, temperature and supply voltage. As the variations in supply voltage can be particular significant in battery operated devices, maintaining a constant switch resistance helps keep transmitted power constant. Therefore, the quality-factor of the capacitor array is improved by providing constant load resistance.

One advantage of the charge pump embodiment shown in FIG. 4 is that the gate voltage can be pumped up to be above the supply voltage. Thus, even though the supply voltage may drop lower than the voltage required by the switch transistors in the capacitive array, use of the charge pump 417 allows generation of a gate voltage higher than the supply voltage.

Figure 5:
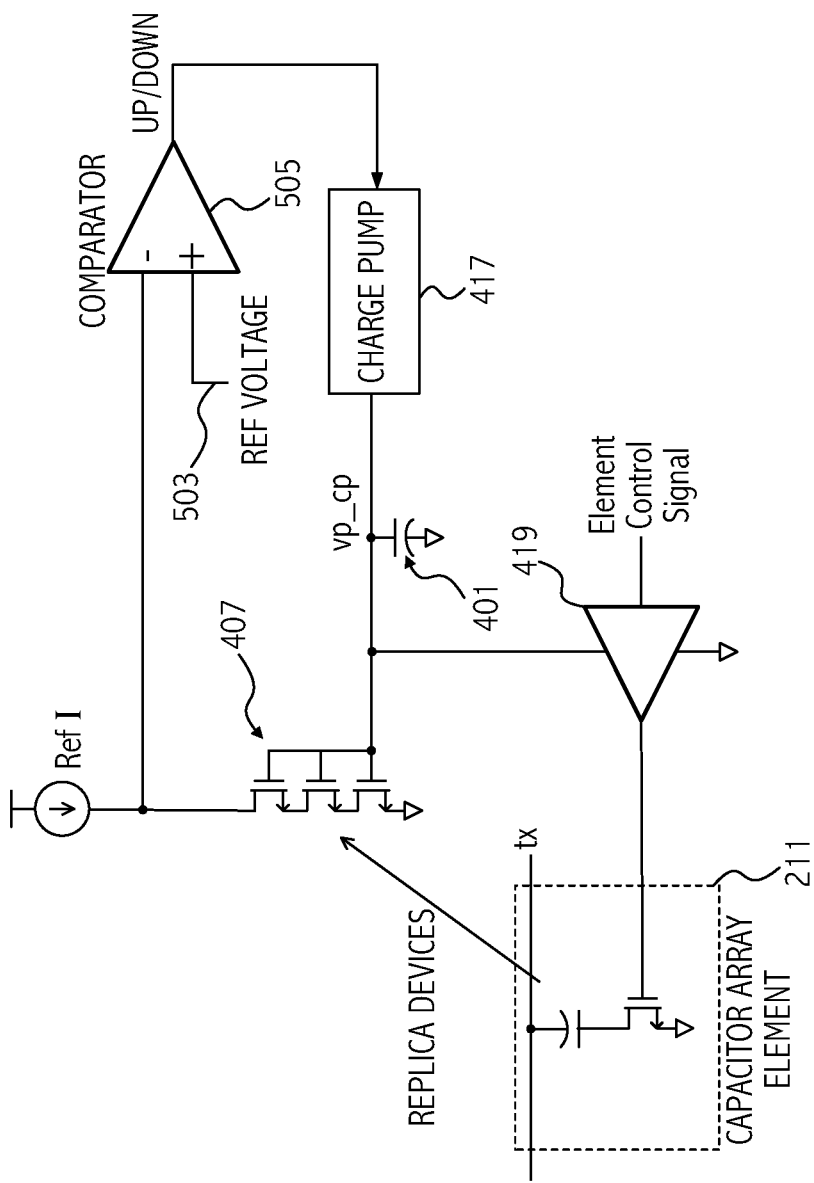
FIG. 5 illustrates a high level diagram of another embodiment of the invention using a reference voltage and a reference current having a known ratio.

Referring to FIG. 5, illustrated is another embodiment to maintain constant switch resistance across replica devices 407 and thus constant impedance in the capacitive array elements 201. The embodiment illustrated in FIG. 5 may be particularly useful where the temperature coefficient of the reference resistance is greater than system requirements can tolerate. A well regulated current is supplied from current source 501. The voltage across the replica devices is compared to a well regulated reference voltage 503 in comparator 505. The reference voltage and current ratio may be controlled using, e.g., reference bandgap circuits. When the voltage across the replica devices deviates from the reference voltage and thus the resistance of the replica devices has changed, the servo loop functions to adjust the gate voltage of the replica devices to bring the resistance of the replica devices back to a desired level. Thus, a substantially constant on resistance of the capacitive array switch elements is maintained.

The description of the invention set forth herein is illustrative. Variations and modifications of the embodiments disclosed herein may be made based on the description set forth herein, without departing from the scope of the invention as set forth in the following claims.

What is claimed is:

1. A method comprising:
enabling a unit element of a variable capacitor array by supplying to one or more transistors within the unit element a gate voltage that adjusts to compensate for variations in at least one of supply voltage and temperature, to maintain a substantially constant impedance of the unit element;
comparing a reference resistance to a resistance of one or more replica devices corresponding to the one or more transistors, the reference resistance corresponding to a desired resistance value of the one or more replica devices and generating an indication of the comparison;
wherein comparing the reference resistance to the resistance of the one or more replica devices includes,
comparing a first voltage across the one or more replica devices to a second voltage across the reference resistance and generating the indication, the first voltage corresponding to the resistance of the one or more replica devices and the second voltage corresponding to the reference resistance;
supplying from a current source a current to the one or more replica devices and to the reference resistance to generate the first voltage and the second voltage, the current being supplied to the one or more replica devices during a first time period to develop the first voltage and the current being supplied to the reference resistance during a second time period, the first and second time periods being non-overlapping; and
adjusting the resistance of one or more replica devices to substantially maintain the desired resistance value by adjusting the gate voltage according to the indication.

2. The method as recited in claim 1 further comprising charging a capacitor according to the indication and using a voltage across the capacitor to generate the gate voltage.

3. The method as recited in claim 2 further comprising charging the capacitor to a higher voltage than a supply voltage supplied to an integrated circuit on which the capacitor array is disposed.

4. The method as recited in claim 2 further comprising supplying the voltage across the capacitor to a logic gate and supplying the gate voltage from the logic gate.

5. The method as recited in claim 1 further comprising maintaining the substantially constant impedance of the unit element over process variations.

6. An apparatus comprising:
a capacitor array including a plurality of unit elements, each unit element including at least one capacitor coupled to at least one transistor to enable charging of the at least one capacitor;
a control voltage circuit coupled to supply a control voltage to a gate terminal of the at least one transistor, wherein the control voltage varies according to changes in at least one of temperature and supply voltage, to thereby maintain a resistance-capacitance (RC) product of each capacitor array unit element substantially constant over changes in the temperature and the supply voltage, when the capacitor array unit element is enabled;
wherein the control voltage circuit comprises,
a compare circuit to compare resistance of one or more replica devices corresponding to the one or more transistors to a desired value, the desired value corresponding to a reference resistance;
a current source coupled to supply current to the reference resistance and the one or more replica devices, wherein the current source is coupled to supply current to the reference resistance during a first time period according to a first control signal and the current source is coupled to supply current to the one or more replica devices during a second time period according to a second control signal, the first and second time periods being non-overlapping.

7. The apparatus as recited in claim 6 wherein the compare circuit is coupled to compare a first voltage across the reference resistance to a second voltage across the replica devices and supply an indication thereof.

8. The apparatus as recited in claim 7 wherein the control voltage circuit further comprises a charge pump and a capacitor coupled to the charge pump that charges the capacitor according to the indication.

9. The apparatus as recited in claim 8 wherein the charge pump is configured to charge the capacitor to a higher voltage than a supply voltage supplied to an integrated circuit on which the charge pump is disposed.

10. The apparatus as recited in claim 8 further comprising a logic gate coupled to receive a voltage across the capacitor and supply the voltage across the capacitor as the gate voltage according to a digital control signal supplied to the logic gate.

11. The apparatus as recited in claim 7 wherein the compare circuit is a switched capacitor comparator coupled to sample the first and second voltages according to the first and second control signals.

12. The apparatus as recited in claim 6 wherein the apparatus further comprises a charge pump and an antenna coupled to the capacitor array.

13. The apparatus as recited in claim 6 further comprising first and second transistors respectively coupled to the reference resistance and the one or more replica devices and respectively coupled to the first and second control signals.

14. A radio frequency transmitter comprising:

a power amplifier circuit;

a capacitor array coupled to the amplifier circuit, the capacitor array including a plurality of unit elements, each unit element including at least one capacitor and at least one transistor to enable charging of the at least one capacitor;

a control voltage circuit coupled to supply a control voltage to a gate of the at least one transistor that varies according to changes in at least one of temperature and supply voltage, to thereby maintain a resistance-capacitance (RC) product of each capacitor array unit element substantially constant over changes in the temperature and the supply voltage, when the capacitor array unit element is enabled, the control voltage circuit including, one or more replica devices corresponding to the one or more transistors;

a compare circuit to compare resistance of the one or more replica devices to a desired value and supply an indication thereof, a reference resistance corresponding to the desired value; and a current source coupled to alternately supply current to the reference resistance and the one or more replica devices according to first and second non-overlapping control signals, thereby providing that the reference resistance and the one or more replica devices receive the supplied current during non-overlapping first and second time periods.

\* \* \* \* \*